(12) United States Patent
Vollrath et al.

(10) Patent No.: US 7,023,276 B2
(45) Date of Patent: Apr. 4, 2006

(54) DIFFERENTIAL AMPLIFIER CIRCUIT

(75) Inventors: Joerg Vollrath, Olching (DE); Marcin Gnat, München (DE); Ullrich Menczigar, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/934,396

(22) Filed: Sep. 7, 2004

(65) Prior Publication Data

US 2005/0052238 A1 Mar. 10, 2005

(30) Foreign Application Priority Data

Sep. 8, 2003 (DE) ................................. 103 41 320

(51) Int. Cl.
*H03F 3/45* (2006.01)

(52) U.S. Cl. ...................................................... 330/261

(58) Field of Classification Search ................ 330/253, 330/259, 261, 260
See application file for complete search history.

(56) References Cited

U.S. PATENT DOCUMENTS 3,497,824 A * 2/1970 Goordman .................. 330/258
4,442,408 A * 4/1984 Le .............................. 330/261
5,115,206 A   5/1992 Mack et al.

* cited by examiner

*Primary Examiner*—Robert Pascal
*Assistant Examiner*—Hieu Nguyen
(74) *Attorney, Agent, or Firm*—Edell, Shapiro & Finnan, LLC

(57) ABSTRACT

A differential amplifier circuit has two input transistors, a load element, and a current source. A terminal for an input voltage is connected to a control terminal of a first input transistor. A terminal for a reference voltage is connected to a control terminal of a second input transistor. The two input transistors are connected in parallel between the load element and a terminal of the current source. A terminal for an internal reference potential is connected to a further terminal of the current source. A regulating circuit, is connected to the terminal for the voltage and to the terminal for the reference potential, and regulates the potential of the circuit dependent on changes in the reference voltage. Fluctuations of the reference voltage are compensated by regulation of the internal reference potential. As a result, the operating point of the circuit is stabilized independently of fluctuations of the reference voltage.

9 Claims, 4 Drawing Sheets

DIFFERENTIAL AMPLIFIER CIRCUIT

CROSS REFERENCE TO RELATED APPLICATIONS

This application claims priority under 35 USC §119 to German Application No. DE 103 41 320.0, filed on Sep. 8, 2003, and titled "Differential Amplifier Circuit," the entire contents of which are hereby incorporated by reference.

FIELD OF THE INVENTION

The invention relates to a differential amplifier circuit having two input transistors, a load element and a current source. A terminal for an input voltage is connected to a control terminal of a first input transistor. A further terminal for a reference voltage is connected to a control terminal of a second input transistor. The input transistors are connected in parallel between the load element and a terminal of the current source. A terminal for an internal reference potential is connected to a further terminal of the current source.

BACKGROUND

A known differential amplifier circuit essentially comprises two input transistors, two load elements, and a current source, which are connected between a fixedly predetermined high and low supply potential. The two input transistors are controlled by an input voltage and by a reference voltage. The current source is generally constructed as a current mirror having an input path and an output path. Differential amplifiers are used in memory components, such as, for example, DDR SDRAMs (double data rate synchronous dynamic random access memory) in order to generate signal states 1 (high) or 0 (low). In this case, an input voltage is compared with a predetermined reference voltage. Depending on whether the input voltage is above or below the reference voltage, the differential amplifier supplies the signal state 1 or 0 at the output. Signal transitions from the state 0 to the state 1 are generated by raising the input voltage from a low voltage value to a high voltage value. In the event of the signal transition from state 1 to state 0, the input voltage of the differential amplifier is lowered from a high voltage level to a low voltage level. As soon as the signal level of the input signal reaches the value of the reference voltage, the signal of the differential amplifier changes from one state to the other.

The value of the reference voltage usually cannot be held at a fixed value, it is subject to fluctuations. Fluctuations of the reference voltage bring about a shift in the operating point of the circuit. This has the effect that the point of intersection at which the level of the input voltage intersects the level of the reference voltage shifts. There is also a further consequence of longer or shorter switching times of the differential amplifier due to an altered switching behavior of input transistors and current source transistor, so that the adaptation or synchronization of a clock signal and of the input signals is impaired.

As a further consequence of these lengthened or shortened switching times of the differential amplifier, there are also influences in the set up and hold times. The set up time is the time period during which a signal must already have assumed a defined state at a data input before the signal is processed further after the occurrence of the clock pulse. The hold time describes the time period during which a signal must still be present at a data output after the clock pulse has been effected. Fluctuations of the reference voltage with the abovementioned consequences mean that the set up and hold times have to be dimensioned such that they are comparatively long.

SUMMARY

A differential amplifier circuit, which reduces the influence of fluctuations of the reference voltage on the switching behavior, includes two input transistors, a load element, and a current source. A terminal for an input voltage is connected to a control terminal of a first input transistor. A further terminal for a reference voltage is connected to a control terminal of a second input transistor. The two input transistors are connected in parallel between the load element and a terminal of the current source. Furthermore, a terminal for an internal reference potential, which is connected to a further terminal of the current source, is provided. The regulating circuit is connected to the terminal for the reference voltage and to the terminal for the internal reference potential. The regulating circuit regulates the internal reference potential in a manner dependent on fluctuations of the reference voltage such that the internal reference potential lies below the reference voltage by the magnitude of the control voltage.

The differential amplifier circuit according to the invention gives preference to the regulating circuit having a regulating amplifier having a first input, a second input and an output. The control voltage source is connected between the first input of the regulating amplifier and the terminal of the reference voltage. The second input of the regulating amplifier is connected to the terminal of the internal reference potential.

In the differential amplifier circuit, the regulating circuit has a series transistor. The output of the regulating amplifier is connected to a control input of the series transistor. The series transistor is connected between a terminal for a supply potential and the terminal for the internal reference potential. The first input of the regulating amplifier is an inverting input and the second input is a noninverting input.

The regulating circuit compares the reference and control voltage present in series at the inverting input of the regulating amplifier with the internal reference potential present at the noninverting input. With the aid of the series transistor, the internal reference potential is regulated until the differential input voltage of the regulating amplifier is 0 V. The internal reference potential can thereby be regulated in a manner dependent on fluctuations of the reference voltage. The value of the reference voltage no longer refers to an external supply potential, but to the internal reference potential. Fluctuations of the reference voltage are compensated for by regulation of the internal reference potential on the chip, so that the operating point of the circuit remains stable.

In another embodiment of the differential amplifier circuit according to the invention, the regulating circuit has a voltage generator circuit for generating the internal reference potential. The output of the regulating amplifier is connected to a control input of the voltage generator circuit. The voltage generator circuit is connected between a terminal for a supply potential and the terminal for the internal reference potential.

In this case, the voltage generator circuit may contain a charge pump.

The supply potential can be a negative potential and the charge pump can generate a negative internal reference potential.

The first input of the regulating amplifier can be a noninverting input and the second input can be an inverting input.

In another embodiment, the current source is formed as a current mirror having an input path and an output path, the output path being connected between the terminal for the internal reference potential and the input transistors.

BRIEF DESCRIPTION OF THE DRAWINGS

The invention is explained in more detail below with reference to the figures illustrated in the drawing, in which.

DETAILED DESCRIPTION

Figure 1:
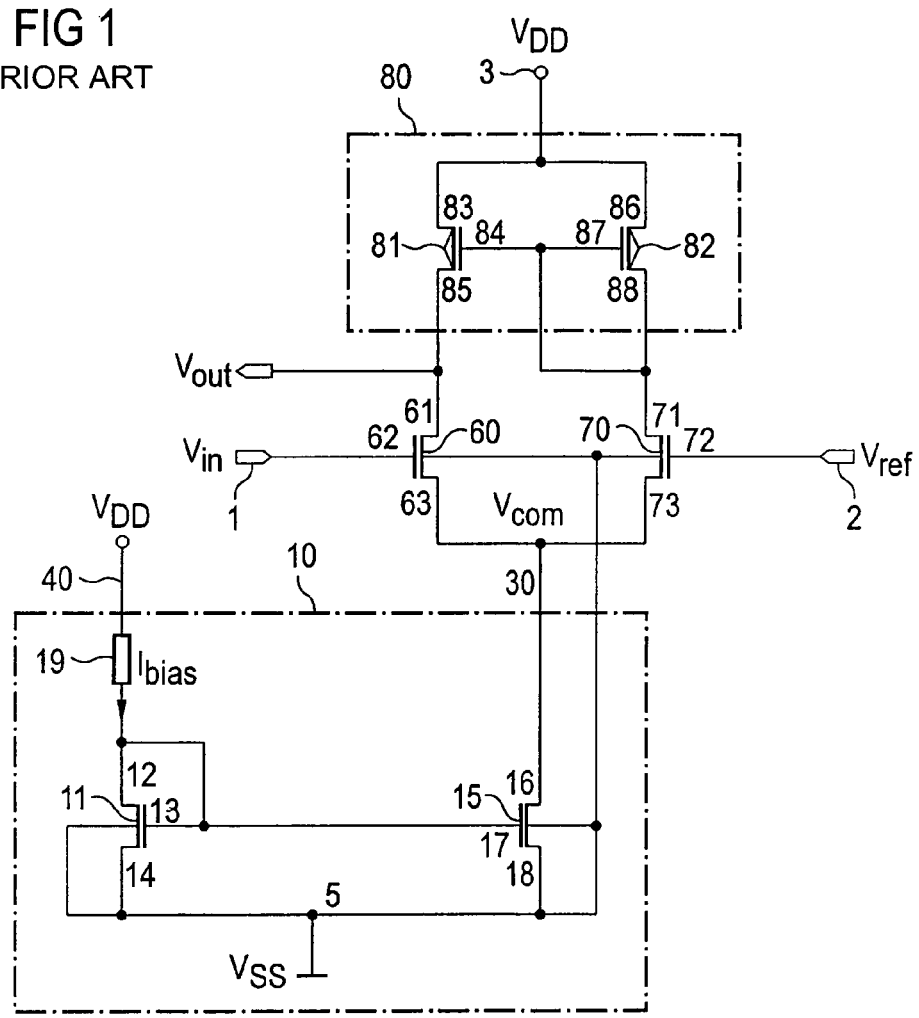
FIG. 1 shows a circuit arrangement of a differential amplifier according to the prior art.

FIG. 1 shows the circuit of a known differential amplifier that includes a load element 80, two input transistors 60, 70, and a current source 10.

The load element 80 is illustrated as an active load, for example, in FIG. 1 and has a transistor 81 and 82 as load elements. The two transistors are situated in two parallel branches and are connected via their terminals 83 and 86 to the terminal 3. The supply voltage $V_{DD}$ is applied to the terminal 3. The two transistors are connected via their terminals 84, 87. In the case of the transistor 82, the terminal 87 is additionally short-circuited with the terminal 88 so that the transistor is connected as a diode. The input transistor 60 is connected by its terminal 62 to the voltage $V_{in}$. It is connected to the terminal 85 of the transistor 81 via the terminal 61, at which the output voltage $V_{out}$ of the circuit is tapped off. The input transistor 70 is connected to the reference voltage $V_{ref}$ via the terminal 72. Furthermore, it is connected to the terminal 88 of the transistor 82 via its terminal 71.

In the input path 40, the current source 10 has a resistor 19 connected to the supply voltage $V_{DD}$ by one terminal and to the transistor 11 by the other terminal. The input current $I_{Bias}$ flows in the input path 40. The transistor 11 is connected as a diode by the terminals 12 and 13 being short-circuited. The transistor 15 is situated in the output path of the current source via which transistor the output current is fed into the two parallel branches of the differential amplifier. It is connected by its terminals 16, 18 between the input transistors 60, 70 and the terminal 5 of the internal reference potential $V_{SS}$ and is additionally connected to the terminal 13 of the transistor 11 via its terminal 17.

If field-effect transistors, for example, are used for the two transistors 60 and 70, then the gate-source voltage $U_{GS}$ determines the behavior of the transistors. The voltage $V_{in}$ is generally centered around the voltage $V_{ref}$. Fluctuations of the reference voltage $V_{ref}$ lead to a change in the potential $V_{com}$ at the terminal 63/73 of the two transistors 60 and 70. In this case, the potential is established such that the current provided by the current source 10 is distributed between the two parallel branches depending on the ratio of the control voltages $V_{in}$ and $V_{ref}$. If the two potentials $V_{in}$ and $V_{ref}$ are the same with respect to the reference potential $V_{SS}$, then in the ideal case of identical parallel branches, the same current flows in both. If the potential $V_{ref}$ at the terminal 2 changes, then the current that flows in the parallel branches and thus also the potential $V_{com}$ also change. A decrease in the voltage $V_{ref}$ brings about a decrease in the voltage $V_{com}$ at the node 63/73. For specific process, temperature and voltage values of $V_{ref}$, the potential $V_{com}$ at the node of the transistors may fall such that the transistor 15 moves out of saturation. The current $I_{BIAS}$ prescribed by the current source and thus also the voltage $U_{GS}$ of the transistors 60 and 70 decrease as a result. This results in a shift in the operating point of the circuit and in altered switching times.

Figure 2:
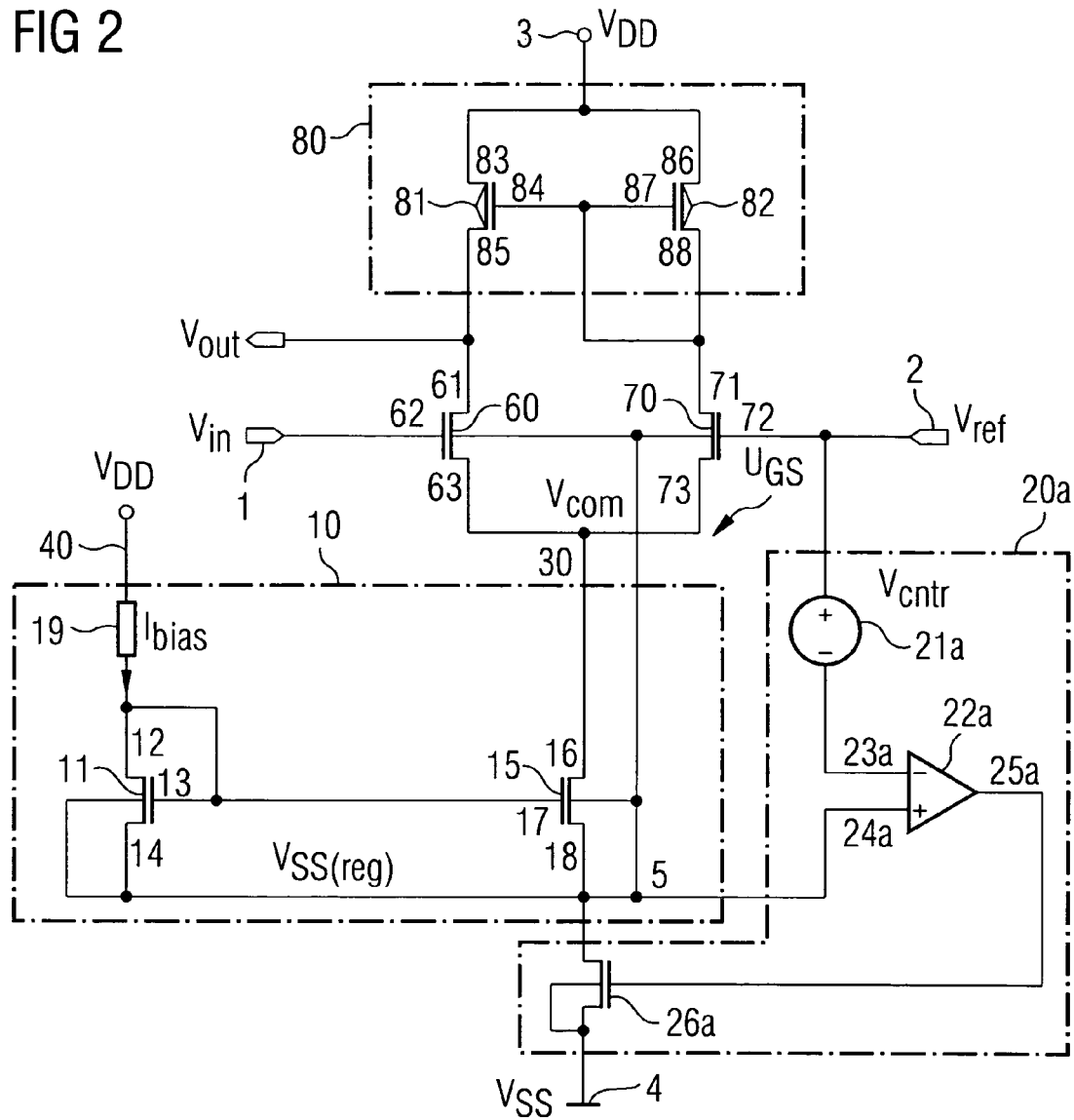
FIG. 2 shows a circuit arrangement of a differential amplifier for regulating a positive internal reference potential according to the invention.

FIG. 2 shows a circuit arrangement of a differential amplifier according to the invention. In addition to the elements of the circuit that are described in FIG. 1, the improved circuit has a regulating circuit 20a. The regulating circuit 20a includes a regulating amplifier 22a having an inverting input 23a, a noninverting input 24a, and an output 25a. A control voltage source 21a, which provides a control voltage $V_{cntr}$, is connected to the input 23a. The control voltage source is connected to the terminal 2 at which the reference voltage is present. The output 25a is connected to the control input of a series transistor 26a. The series transistor 26a is connected between the terminal 5 of the current source 10, which is at the regulatable internal reference potential $V_{SS(reg)}$, and the terminal 4 for the external supply potential $V_{SS}$.

The series transistor 26a is controlled by the regulating amplifier 22a. In the adjusted state, the differential input voltage of the regulating amplifier is 0 V. The voltage $V_{SS(reg)}$ is then equal to the difference between the voltages $V_{ref}$ and $V_{cntr}$. If the potential $V_{ref}$ fluctuates, then the differential input voltage becomes unequal to 0 V. By means of the transistor 26a acting as an actuator, $V_{SS(reg)}$ is then regulated until the differential input voltage of the regulating amplifier is 0 V again or $V_{SS(reg)} = V_{ref} - V_{cntr}$. Thus, although the two potentials $V_{ref}$ and $V_{SS(reg)}$ have been altered in terms of magnitude, the potential difference between these two potentials has remained the same. The operating point of the circuit, which is defined by the voltage $U_{GS}$ of the input transistors 60 and 70, thereby remains in the same state.

FIG. 2 illustrates the case in which the external supply potential $V_{SS}$ is at 0 V and the internal reference potential $V_{SS(reg)}$ is regulated to a value above this potential by the actuator 26a.

Figure 3:
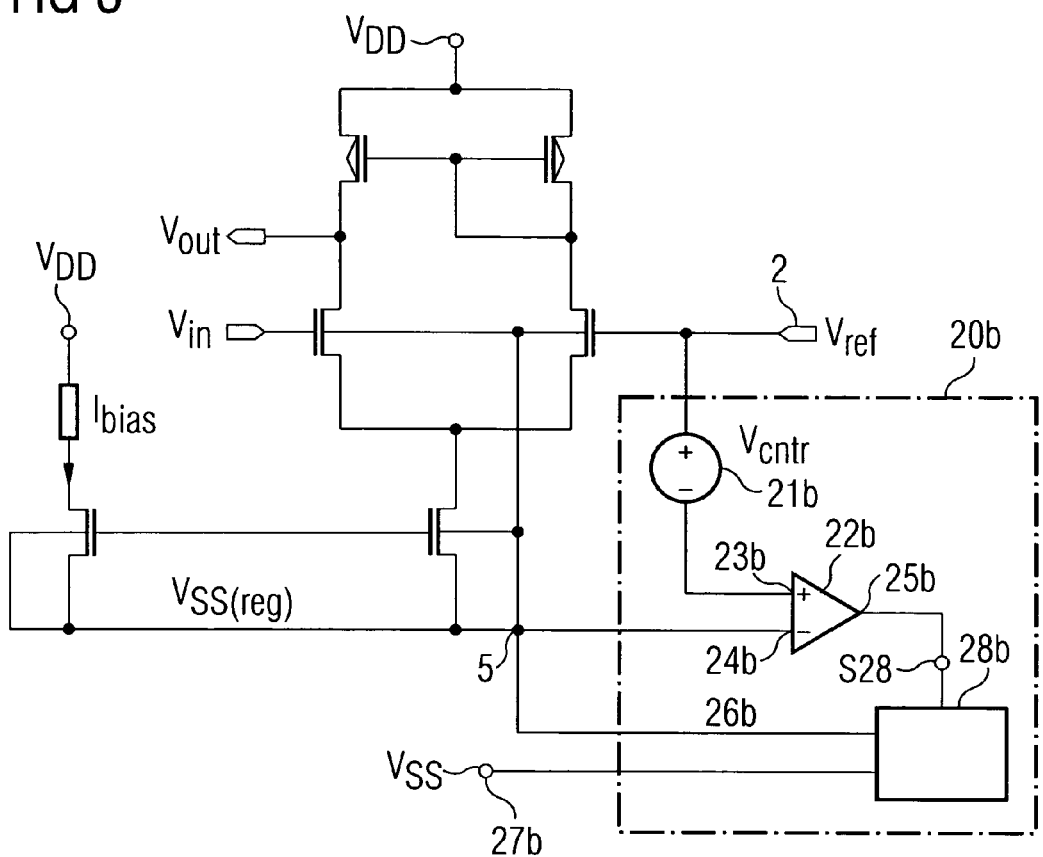
FIG. 3 shows a circuit arrangement of a differential amplifier for regulating a negative internal reference potential.

FIG. 3 shows the case in which the potential $V_{SS(reg)}$ is regulated to a value below 0 V. The circuit differs from the above-described circuit of FIG. 2 by the regulating circuit 20b. Therefore, only this circuit component is described below. The regulating circuit 20b includes a regulating amplifier 22b having a noninverting input 23b, an inverting input 24b, and an output 25b. A control voltage source 21b, which provides a control voltage $V_{cntr}$, is connected to the input 23b. The control voltage source is connected to the terminal 2 at which the reference voltage $V_{ref}$ is present. The regulating circuit 20b furthermore has a voltage generator circuit 28b, which has a charge pump 281, for example. A control input S28 of the charge pump 28b is driven via the output 25b of the regulating amplifier. A terminal 27b of the voltage generator circuit 28b is connected to the negative supply potential $V_{SS}$. The output 26b of the charge pump is connected to the terminal 5 of the internal regulatable reference potential $V_{SS(reg)}$. This circuitry makes it possible to generate a negative internal reference potential $V_{SS(reg)}$.

Figure 4A:
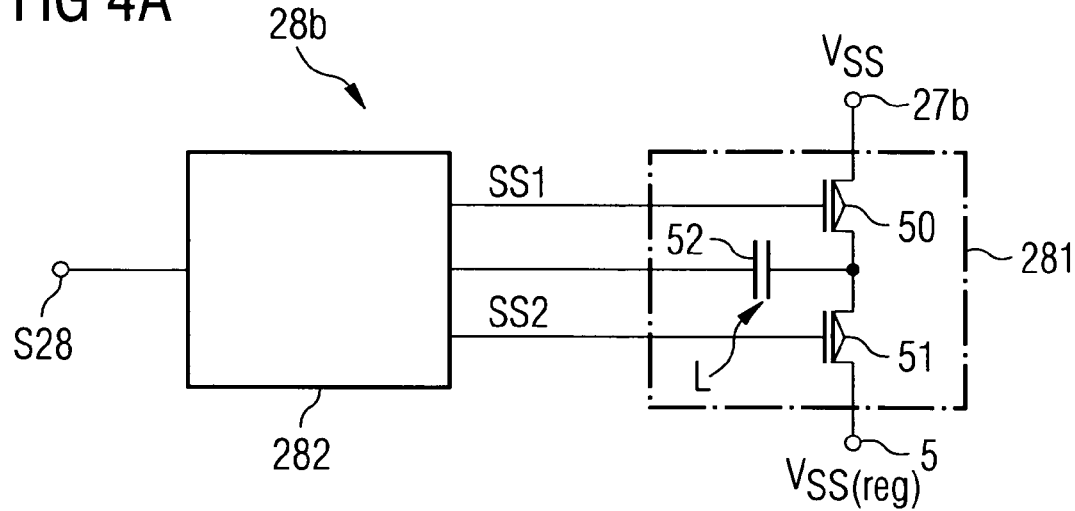
FIG. 4 shows a circuit arrangement of a charge pump for generating a negative charge.

FIG. 4A shows a simple configuration of the voltage generator circuit 28b. The voltage generator circuit 28b has a charge pump 281 driven by a control circuit 282 by control signals SS1 and SS2. The charge pump includes two switches 50 and 51, designed as P-MOS transistors, for example, and a charging capacitance 52. The capacitance 52 is connected to the terminal 27*b*, at which the supply voltage $V_{SS}$ is present, via the switch 50 and to the terminal 5 of the internal regulatable reference potential $V_{SS(reg)}$ via the switch 51. The control circuit 282 evaluates the output signal generated by the regulating amplifier 22*b* at the output terminal 25*a*. The signal has an item of information concerning the magnitude by which the reference voltage $V_{ref}$ differs from the internal reference potential $V_{SS(reg)}$. If the internal reference potential lies below the reference voltage by less than the magnitude of the control voltage $V_{cntr}$, the control circuit 282 initiates the pump process. In this way, the actual pump process is controlled by the control circuit by the control signals SS1 and SS2.

Figure 4B:
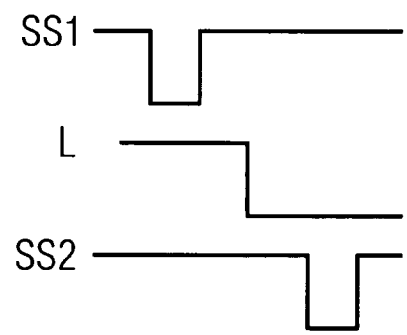

FIG. 4B shows the profile of the control signals SS1 and SS2 for driving the P-MOS transistors 50 and 51 and also the charging state L on the charging capacitance 52.

The pump process has two pump cycles. During the first cycle, the switch 51 is opened by the control circuit 282 by the control signal SS2. The switch 50 is closed by the control circuit 282 by the control signal SS1 and connects the supply voltage $V_{SS}$ to the charging capacitance 52, on which a negative charge is stored. During the second cycle, the switch 50 is opened and the switch 51 is closed by the control signal SS2. The capacitance 52 is thereby connected to the terminal 5 of the internal regulatable reference potential $V_{SS(reg)}$. The charge stored on the capacitance 52 flows away via the switch 51 to the terminal 5 and lowers the internal reference potential $V_{SS(reg)}$.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Terminal for $V_{in}$
2 Terminal for $V_{ref}$
3 Terminal for supply potential $V_{DD}$
4 Terminal for supply potential $V_{ss}$
5 Terminal for $V_{SS}/_{SS(reg)}$
10 Current source
11 Transistor
12 First terminal of the transistor 11
13 Second terminal of the transistor 11
14 Third terminal of the transistor 11
15 Transistor
16 First terminal of the transistor 15
17 Second terminal of the transistor 15
18 Third terminal of the transistor 15
19 Resistor
20 Regulating circuit (variant a,b)
21 Control voltage source (variant a,b)
22 Regulating amplifier (variant a,b)
23 First input of 22 (variant a,b)
24 Second input of 22 (variant a,b)
25 Output of 22 (variant a,b)
26 Actuator (variant a)
27 Terminal for the supply potential $V_{SS}$ (variant b)
28*b* Charge pump
30 Output path of the current source 10
40 Input path of the current source 10
50 Switch
51 Switch
52 Charging capacitance
53 Terminal for supply potential $V_{SS}$
60 First input transistor
61 First terminal of the input transistor 60
62 Second terminal of the input transistor 60
63 Third terminal of the input transistor 60
70 Second input transistor
71 First terminal of the input transistor 70
72 Second terminal of the input transistor 70
73 Third terminal of the input transistor 70
80 Load element
81 First transistor of the load element 80
82 Second transistor of the load element 80
83 First terminal of the transistor 81
84 Second terminal of the transistor 81
85 Third terminal of the transistor 81
86 First terminal of the transistor 82
87 Second terminal of the transistor 82
88 Third terminal of the transistor 82
$V_{DD}$ High supply potential
$V_{SS}$ Low supply potential
$V_{in}$ Input voltage
$V_{ref}$ Reference voltage
$V_{out}$ Output voltage
$V_{com}$ Potential at the node 63/73
$V_{cntr}$ Control voltage
$V_{SS(reg)}$ Regulatable reference potential
$I_{BIAS}$ Current in the input path of the current source

We claim:

1. A differential amplifier circuit, comprising:
    a first and second input transistor;
    a load element;
    a current source;
    a terminal for an input voltage, the input voltage terminal connected to a control terminal of the first input transistor;
    a terminal for a reference voltage, the reference voltage terminal connected to a control terminal of the second input transistor, the input transistors being connected in parallel between the load element and a terminal of the current source;
    a terminal for an internal reference potential, the internal reference potential terminal connected to a further terminal of the current source; and
    a regulating circuit having a control voltage source for generating a control voltage, the regulating circuit being connected to the terminal for the reference voltage and to the terminal for the internal reference potential,
    the regulating circuit regulating the internal reference potential in a manner dependent on fluctuations of the reference voltage such that the internal reference potential is less than the reference voltage by a magnitude of the control voltage.

2. The differential amplifier circuit as claimed in claim 1, wherein the regulating circuit includes a regulating amplifier having a first input, a second input, and an output,
    the control voltage source is connected between the first input of the regulating amplifier and the terminal of the reference voltage, and
    the second input of the regulating amplifier is connected to the terminal of the internal reference potential.

3. The differential amplifier circuit as claimed in claim 2, wherein the regulating circuit has a series transistor, the output of the regulating amplifier is connected to a control input of the series transistor, and the series transistor is connected between a terminal for a supply potential and the terminal for the internal reference potential.

4. The differential amplifier circuit as claimed in claim 3, wherein the first input of the regulating amplifier is an inverting input, and the second input of the regulating amplifier is a noninverting input.

5. The differential amplifier circuit as claimed in claim 2, wherein the regulating circuit has a voltage generator circuit for generating the internal reference potential, the output of the regulating amplifier is connected to a control input of the voltage generator circuit, and the voltage generator circuit is connected between a terminal for a supply potential and the terminal for the internal reference potential.

6. The differential amplifier circuit as claimed in claim 5, wherein the voltage generator circuit has a charge pump.

7. The differential amplifier circuit as claimed in claim 6, wherein the supply potential is formed as a negative potential and the charge pump generates a negative internal reference potential.

8. The differential amplifier circuit as claimed in claim 5, wherein the first input of the regulating amplifier is a noninverting input, and the second input of the regulating amplifier is an inverting input.

9. The differential amplifier circuit as claimed in claim 1, wherein the current source is formed as a current mirror having an input path and an output path, the output path being connected between the terminal for the internal reference potential and the input transistors.

* * * * *